(12) United States Patent
Raz et al.

(10) Patent No.: US 9,876,329 B2
(45) Date of Patent: Jan. 23, 2018

(54) ONE PLUS ONE REDUNDANT OPTICAL INTERCONNECTS WITH AUTOMATED RECOVERY FROM LIGHT SOURCE FAILURE

(71) Applicant: Technische Universiteit Eindhoven, Eindhoven (NL)

(72) Inventors: Oded Raz, Eindhoven (NL); Teng Li, Eindhoven (NL)

(73) Assignee: Technische Universiteit Eindhoven, Eindhoven (NL)

( * ) Notice: Subject to any disclaimer, the term of this patent is extended or adjusted under 35 U.S.C. 154(b) by 0 days.

(21) Appl. No.: 15/286,192

(22) Filed: Oct. 5, 2016

(65) Prior Publication Data
US 2017/0040772 A1    Feb. 9, 2017

Related U.S. Application Data

(63) Continuation-in-part of application No. 15/227,710, filed on Aug. 3, 2016, now abandoned.

(60) Provisional application No. 62/200,240, filed on Aug. 3, 2015.

(51) Int. Cl.

| G02B 6/12 | (2006.01) |
|---|---|
| H01S 5/068 | (2006.01) |
| H01S 5/42 | (2006.01) |
| H01S 5/022 | (2006.01) |
| G02B 6/122 | (2006.01) |
| G02B 6/35 | (2006.01) |
| G02B 6/32 | (2006.01) |
| G02B 6/30 | (2006.01) |
| H04B 10/50 | (2013.01) |
| H01S 5/40 | (2006.01) |

(52) U.S. Cl.
CPC ........ *H01S 5/06825* (2013.01); *G02B 6/1221* (2013.01); *G02B 6/30* (2013.01); *G02B 6/32* (2013.01); *G02B 6/3588* (2013.01); *H01S 5/02284* (2013.01); *H01S 5/423* (2013.01); *H04B 10/50* (2013.01); *H01S 5/4012* (2013.01)

(58) Field of Classification Search
None
See application file for complete search history.

(56) References Cited

U.S. PATENT DOCUMENTS

| 5,707,139 | A | 1/1998 | Haitz | |
|---|---|---|---|---|
| 6,265,857 | B1* | 7/2001 | Demsky | G05F 3/245 323/312 |
| 7,831,151 | B2 | 11/2010 | Trezza | |

(Continued)

*Primary Examiner* — Tina Wong
(74) *Attorney, Agent, or Firm* — Lumen Patent Firm (57) ABSTRACT

An optical interconnect device is provided that includes a first vertical cavity of surface emitting laser (VCSEL), connected in parallel with a second VCSEL, an optical coupler that is configured to direct the light output from the first VCSEL and the second VCSEL to a single optical fiber, where a common connection of each VCSEL is controlled using a MOSFET/inverter, where in normal operation only one of the first VCSEL or the second VCSEL is enabled, where a common connection of each VCSEL is not directly connected to a ground, and a microcontroller that is configured to switch output from the first VCSEL to the second VCSEL in the event of failure by the first VCSEL, where a failure of the first VCSEL does not result a communication in link failure.

3 Claims, 6 Drawing Sheets

(56) References Cited

U.S. PATENT DOCUMENTS

| | | |
|---|---|---|
| 8,848,757 B2 | 9/2014 | Joseph |
| 2004/0101007 A1* | 5/2004 | Bozso .................. H01S 5/0428 372/38.02 |
| 2017/0040772 A1* | 2/2017 | Raz ..................... H01S 5/06825 |

* cited by examiner

ONE PLUS ONE REDUNDANT OPTICAL INTERCONNECTS WITH AUTOMATED RECOVERY FROM LIGHT SOURCE FAILURE

CROSS-REFERENCE TO RELATED APPLICATIONS

This application is a continuation-in-part of U.S. patent application Ser. No. 15/227,710 filed Aug. 3, 2016, which is incorporated herein by reference. U.S. patent application Ser. No. 15/227,710 claims priority from U.S. Provisional Patent Application 62/200240 filed Aug. 3, 2015, which is incorporated herein by reference.

FIELD OF THE INVENTION

The present invention relates generally to Vertical Cavity of Surface Emitting Laser (VCSEL) based interconnects. More particularly, the invention relates to interconnects where two VCSELs are connected in parallel for each channel, where light from the two sources are directed to a single optical fiber output.

BACKGROUND OF THE INVENTION

Since the Vertical Cavity Surface Emitting Laser (VCSEL) was first introduced for datacomm applications, VCSEL-based transmitters have been widely used in optical interconnect modules. A VCSEL-based optical transmitter offers low power dissipation, low-driver current, high-speed modulation properties, and further offers high wavelength stability. As data rate and bandwidth increase, the reliability of VCSEL becomes a critical issue in optical transmitter system. Thus, if an individual VCSEL breaks down, the entire transceiver module needs to be replaced with extra cost. One proposed solution to overcome the low reliability issues of VCSELs has been to integrate them into pluggable transceiver modules. This can allow for relative quick and simple replacement of optical interconnects in the case that a VCSEL has failed. However, the perceived reliability of the VCSEL and other light sources and the resulting use of pluggable transceiver modules, limits bandwidth density for switches and results in increased cost and power consumption. Another proposed path for improved reliability was suggested through the introduction of redundant VCSELs in parallel interconnect modules. However operation of such a redundant transmitter at high bit rates (10 Gbps) has never been demonstrated and the exact nature of the control circuitry required for its implementation is not clear.

What is needed is a low-cost device that provides redundancy for VCSEL-based transmitters at high data rates.

SUMMARY OF THE INVENTION

To address the needs in the art, an optical interconnect device is provided that includes a first vertical cavity of surface emitting laser (VCSEL), connected in parallel with a second the VCSEL, an optical coupler that is configured to direct the light output from the first VCSEL and the second VCSEL to a single optical fiber, where a common connection of each VCSEL is controlled using a MOSFET/inverter, where in normal operation only one of the first VCSEL or the second VCSEL is enabled, where a common connection of each VCSEL is not directly connected to a ground, and a microcontroller that is configured to switch output from the first VCSEL to the second VCSEL in the event of failure by the first VCSEL, where a failure of the first VCSEL does not result a communication in link failure.

In one aspect of the invention, the optical coupler includes a polymer waveguide that includes a first channel and a second channel, where the first channel and the second channel converge to a third channel, a first lens disposed to direct light output from the first VCSEL to the first channel of the polymer waveguide, and a second lens disposed to direct light output from the second VCSEL to the second channel of a polymer waveguide.

According to one aspect of the invention, the optical coupler includes a first VCSEL lens that is configured to direct the light output from the first VCSEL to a first input of an interposer, and a second VCSEL lens that is configured to direct the light output from the second VCSEL to second input of the interposer, where the interposer includes a first set of mirrors and a second set of mirrors, where the first set of mirrors are configured to direct the light output from the first VCSEL to a third lens, where the second set of mirrors are configured to direct the light output from the second VCSEL to the third lens, where the third lens is configured to direct the light output from the first VCSEL and the light output from the second VCSEL to an input of a multi-mode fiber.

DETAILED DESCRIPTION

An optical interconnect device is provided, where instead of connecting one VCSEL at the end of each driver output, two VCSELs connected in parallel for each channel, according to one embodiment of the invention. The light from the two sources is directed to a single optical fiber output. The common connection of both VCSELs is not directly connected to the ground but is controlled using a MOSFET/inverter. In normal operation only one VCSEL is enabled. If this VCSEL brakes down, a microcontroller is used to switch to the other VCSEL to let the transmitter function. In this way failure of the laser source will not result in link failure.

The current invention improves the lifetime of VCSEL based interconnects. Further, the invention provides graceful degradation of datacomm links, allowing for a scheduled down time for repair of faulty optical transceivers. The invention enables alternating between the two VCSELs so that the total lifetime of the link is doubled.

According to the invention, the key to obtaining the innovative redundant VCSEL based transmitter is to connect two such light sources in parallel to the output of a single VCSEL driver. This requires a very compact integration of the VCSELs so that they can both couple to a single optical fiber. This way both of the light source can be driven by the same data signal and coupled to the same fiber creating a 1+1 redundant optical sources. In a further aspect of the invention, the $2^{nd}$ key requirement is that an additional logic/analogue switch is added to the circuit to allow separate control of the flow of current through any of the two VCSELs. This enables controlling whether the current can flow through the VCSEL or not. By cutting off the current path to the ground, one can effectively disable both or one of the VCSELs connected in parallel to the driver output. Schematic sketches showing this connectivity option are provided in FIGS. 1A-1C.

Figure 2:
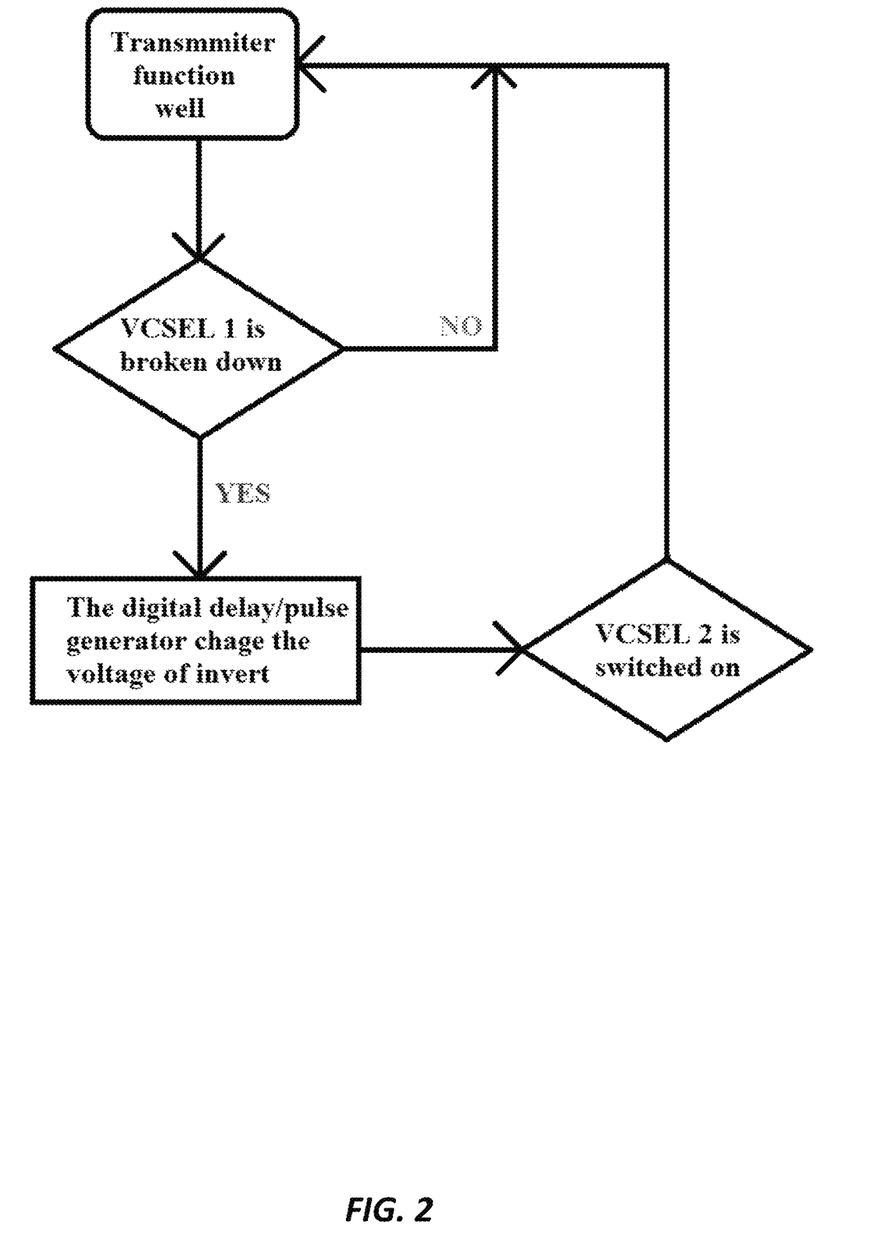
FIG. 2 shows flowchart of self-recovery of VCSEL channel from single VCSEL failure, according to one embodiment of the invention.
Figure 3A:
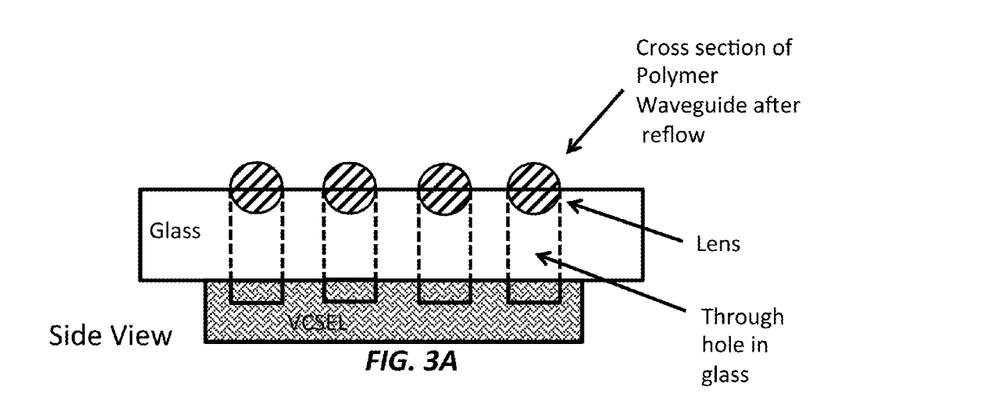
FIGS. 3A-3C show embodiments of the optical coupler, according to the current invention.
Figure 3B:
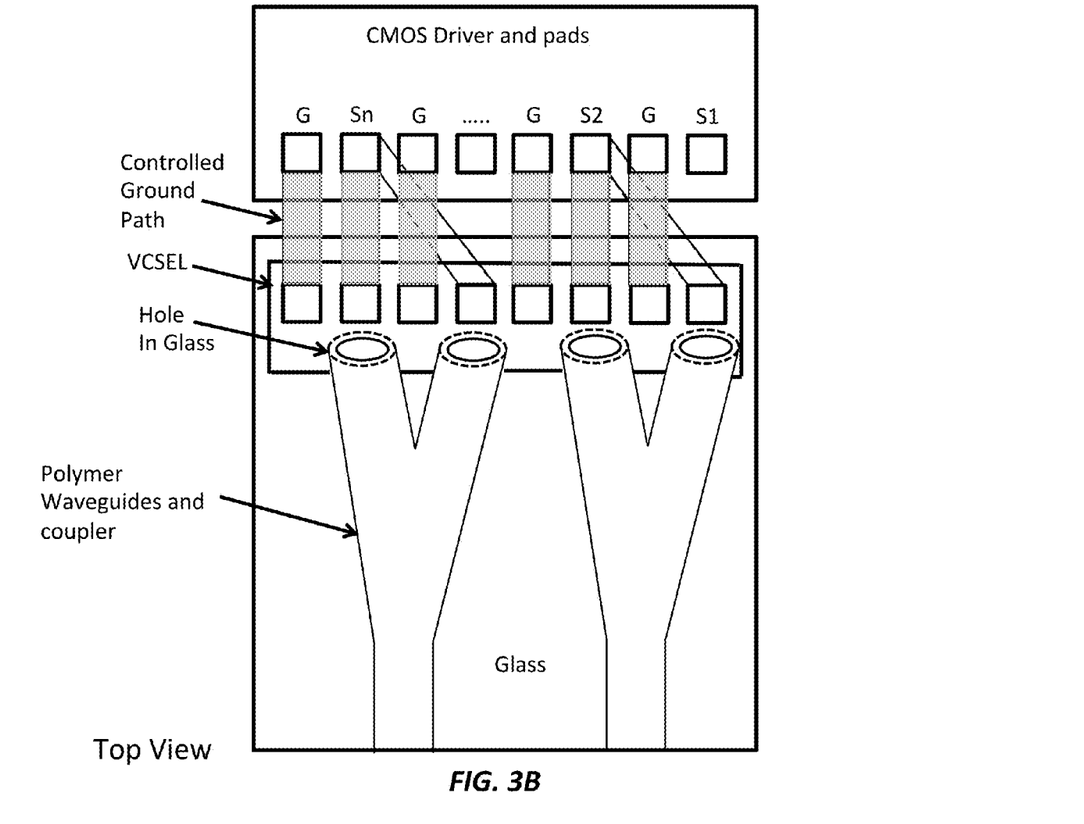
Figure 3C:
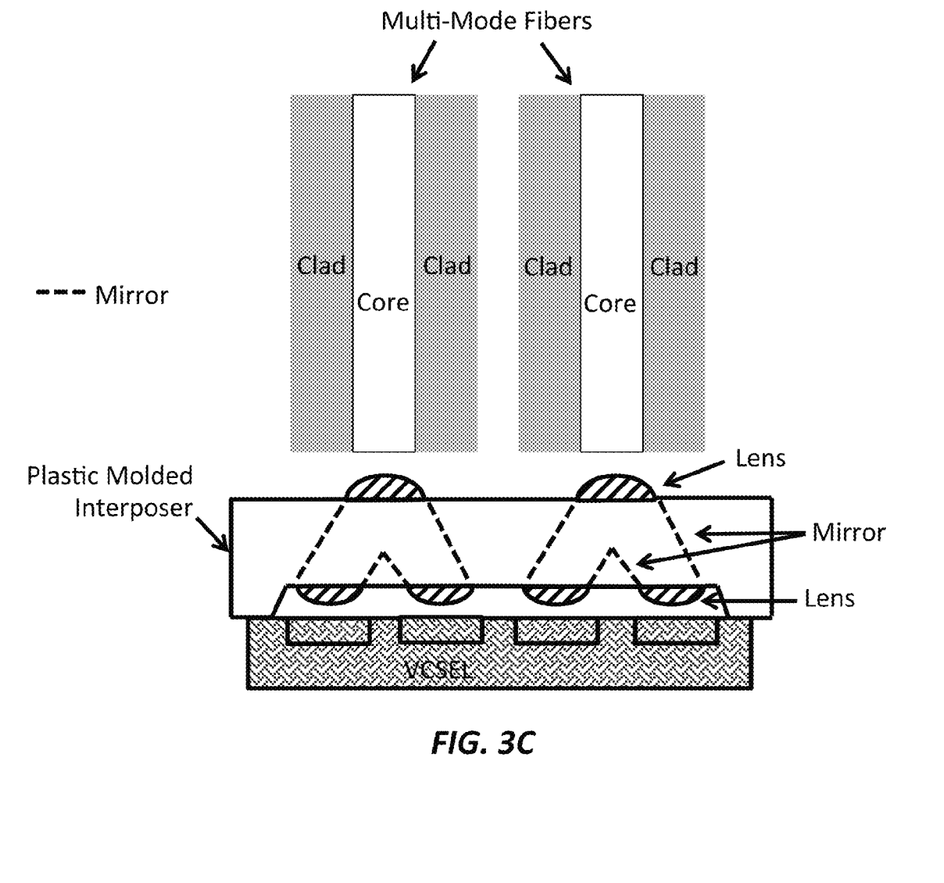

Most CMOS VCSEL drivers monitor their outputs to insure that in the case of a failure of the VCSEL (either a short circuit or an open circuit) the output stage can be disabled to avoid sending a high current into a short or forcing a high voltage on the output stage. FIG. 2 shows the logical operation that allows the VCSEL driver accompanied by a micro controller and two VCSELs to automatically recover from a breakdown of a VCSEL, according to one embodiment. In essence the event of a VCSEL failure will cause the driver to create an interrupt of the micro-controller, which in turn will poll the driver on which channel has failed and for what reason, and will further create the required enable and disable signals to the gates controlling the current return path to the ground from the primary and auxiliary VCSELs.

It is believed that there is no example of a VCSEL-based interconnect circuit that can duplicate this kind of function. In case redundancy is required, most systems will have a full redundant link and will switch to the redundant link in case a fault has been detected. This operation is usually driven by a higher network layer than the physical layer. The implementation of the current invention can be completely configured inside the transceiver module, according to one embodiment.

According to a further embodiment of the invention, the inverter/gate can be integrated in the CMOS driver chip and two independent VCSELs can be redesigned on one substrate. Here, two VCSELs share the same single driver output and a Complementary Metal Oxide Semiconductor (CMOS) based inverter is used to switch the VCSELs individually between their on and off states. In one example, both of the VCSELs achieve 10 Gbps error-free performance independently with similar performance to a single VCSEL arrangement and a commercial module (SFP). According to the current invention, provided is an automatic recovery system from VCSEL failure based on the use of small-pitch VCSEL array and a simple integrated driver chip including a microcontroller, output fault detection circuits and switches of VCSELs.

In one example of the invention, the VCSEL-based transmitter is made up of a Printed Circuit Board (PCB), where a 10 Gbps CMOS driver IC, two 10 Gbps 850 nm multimode VCSEL arrays, and a CMOS dual inverter gate are placed and glued. The PCB board is meant to provide the metal tracks between electrical contacts and a CXP edge connector. FIG. 1B shows a schematic diagram of the connections between the components. Instead of connecting one VCSEL to each driver output, two VCSELs are connected in parallel to the same driver source and their operation state is controlled by controlling the path from the cathode to the ground or Vcc potential. In case one VCSEL breaks down, the auxiliary VCSEL can be switched on. The flowchart of redundant VCSELs system is shown in FIG. 2.

Figure 1A:
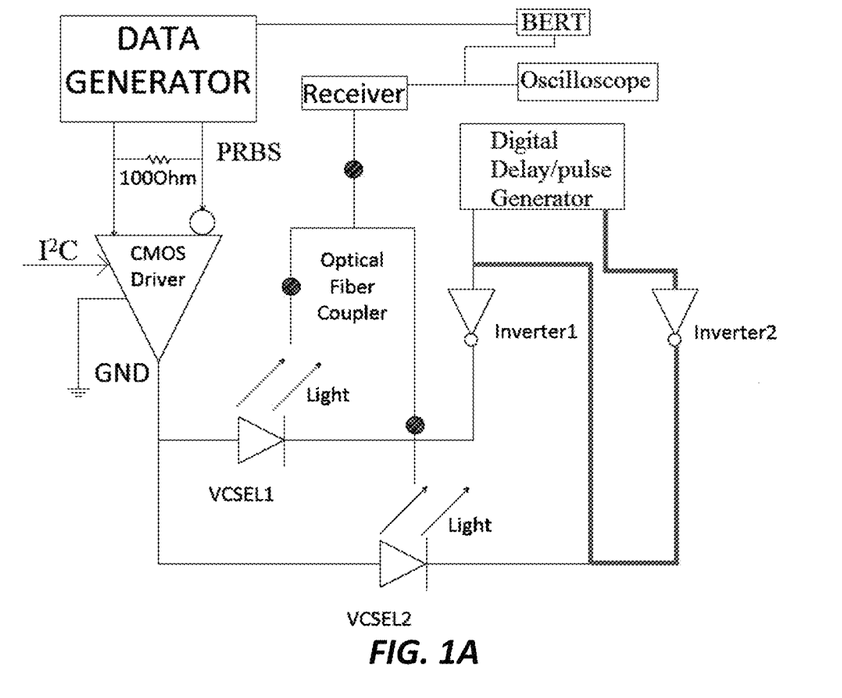
FIGS. 1A-1C show schematic drawings of redundant VCSEL connection and control, according to one embodiment of the invention.
Figure 1B:
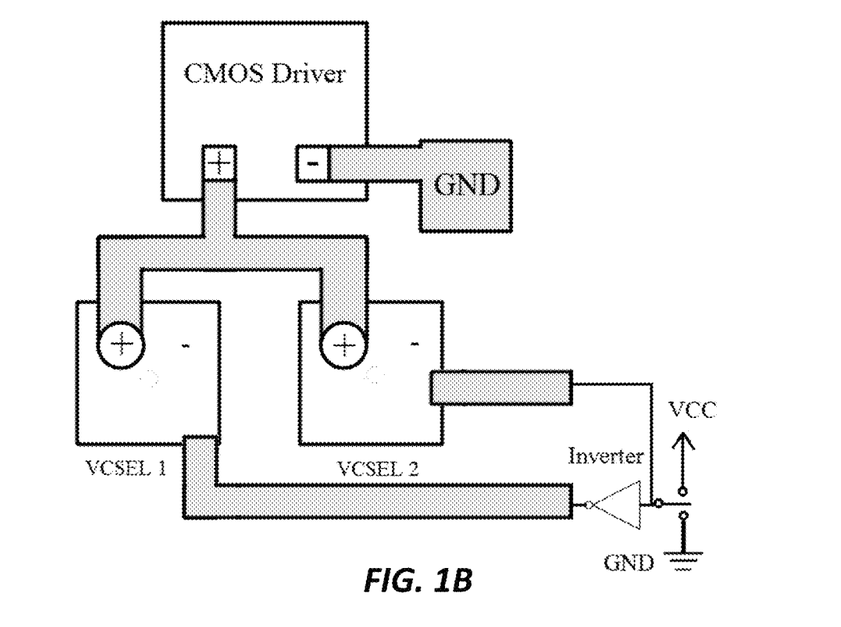

In the experimental schematic shown in FIG. 1A, the differential signals from the data generator are fed into the CMOS driver on 100 Ohm microstrip transmission line through the CXP evaluation board. The optical signals emitted from both VCSELs are coupled into a 50:50 2×1 multimode optical fiber coupler. This way the optical signal from both VCSELs can be detected by a single optical receiver. A digital delay/pulse generator is utilized to change the voltage of the inverter in order to control the current return path of the two VCSELs independently. To characterize the performance of this redundant VCSELs system, 10 Gpbs differential electronic signal with $2^{31}-1$ non-return-to-zero (NRZ) pseudo random binary sequences (PRBS) is used in this experiment. The control voltage from the inverter is 3.3 V.

Figure 4A:
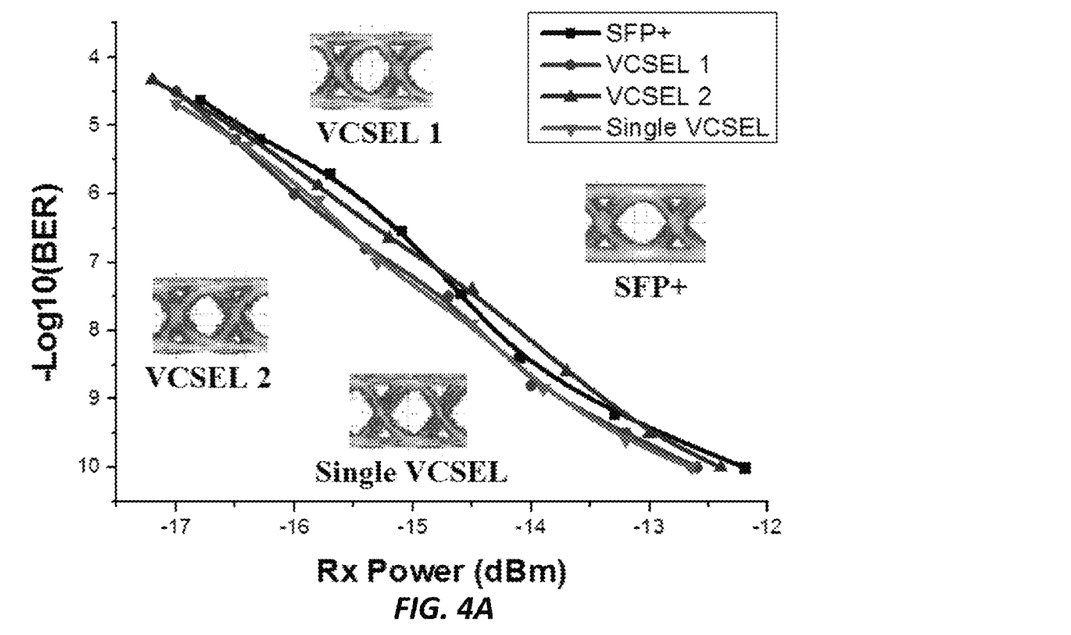
FIG. 4A-4B show (4A) Eye diagram at 10 Gbps (21.3 mV/div) and error bit rate test results, (4B) selected output of two VCSELs (2 ms/div) according to the current invention.
Figure 4B:
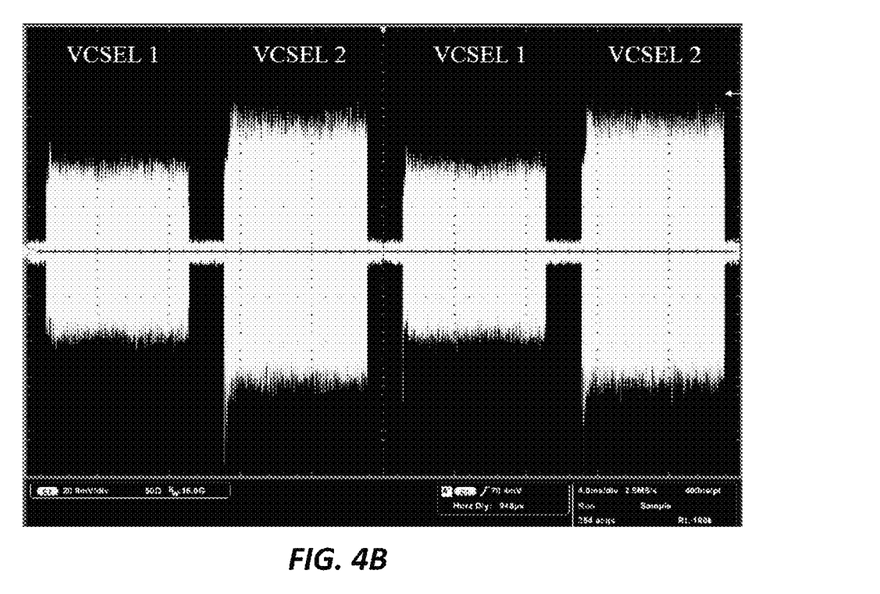

As shown in FIG. 1, two VCSELs in the transmitter with a 4.3 mA bias current and a 8 mA modulation current amplitude are enabled by the inverters to separately measure the eye diagram at 10 Gbps. Using the same setup the bit error rate at 10 Gbps was also tested for both VCSELs connected in parallel, an SFP+ module and a single VCSEL based transmitter, which contains only one VCSEL connected to a single driver output with same bias current and modulation current amplitude. In addition, the eye patterns have been measured for all configurations. The results above are shown in FIGS. 4A-4B. As can be seen, these two VCSELs show error-free performance at 10 Gbps when the Rx input power is −12.6 dBm. Results for the single VCSEL and SFP+ module are indistinguishable.

The digital delay/pulse generator is also used with a 3.3V gate signal to switch alternatively one the two VCSELs every 5 ms and the test setup is shown in FIG. 1A, where it is noted that this relatively slow switch time is useful for demonstrating the time trace. FIG. 4B shows the 10 Gbps data pattern coming alternatively from the two VCSELs, as scheduled by the inverters. A guard band between the two VCSELs of 1 ms has been used to better visualize the time traces.

Figure 1C:
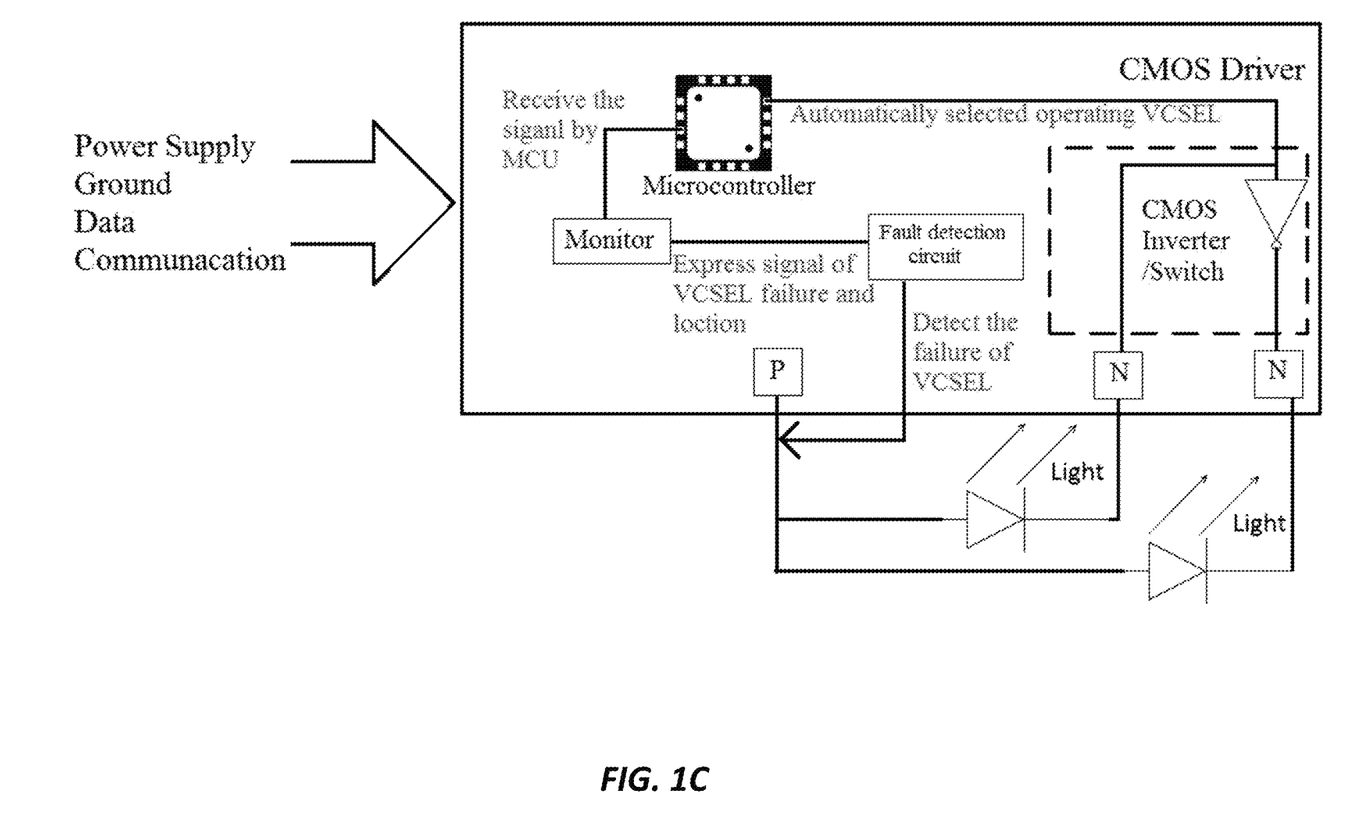

According to a further embodiment of the invention, in order to simplify the system structure, the microcontroller and inverters can be directly integrated inside the CMOS driver. Most CMOS drivers have the fault detection circuit integrated inside them to senses for short circuit or open circuit fault conditions. The failure of a VCSEL can cause the driver to create an interrupt of the microcontroller, which will poll the CMOS driver on which channel has failed and further create the required enable and disable signals to the gates controlling the current return path from the primary and auxiliary VCSELs. In this way an automated recovery mechanism from VCSEL failure in an optical transmitter can be created as shown in FIG. 1C. In one example, a special small-pitch mesa-isolated VCSEL array, in which the active diameter between two VCSELs is only 9 µm, can be used to increase the bandwidth density. By using such a light source, the 50:50 2×1 multimode optical fiber coupler becomes redundant as light from both VCSELs can be launched into a single multimode optical fiber reducing the cost and insertion losses.

A low-cost redundant VCSEL based transmitter has been demonstrated, which can overcome a single light source failure. This system includes two VCSELs connected in parallel to each driver channel. The common connection of both VCSELs is not directly to the ground but is controlled using a CMOS inverter. The system enables alternating between the two VCSELs so as to improve the reliability performance. Bit error rate (BER) performance of both VCSELs has been measured at 10 Gbps with no performance difference between the two VCSELs, a single VCSEL transmitter or a commercial SFP+ module showing its robustness.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example the same redundancy can be used for other types of lasers like DFB or DBR lasers which are integrated on the same planar optical integrated circuits. It can also be applied for the receiver circuit where the VCSELs are replaced with photo diodes and the VCSEL driver IC is replaced with a TIA CMOS chip. All such variations are considered to be within the scope and spirit of the present invention as defined by the following claims and their legal equivalents.

What is claimed:

1. An optical interconnect device, comprising:
   a) a first vertical cavity of surface emitting laser (VCSEL), connected in parallel with a second said VCSEL;
   b) an optical coupler, wherein said optical coupler is configured to direct a light output from said first VCSEL and said second VCSEL to a single optical fiber, wherein a common connection of each said VCSEL is controlled using a MOSFET/inverter, wherein in normal operation only one of said first said VCSEL or said second VCSEL is enabled, wherein a common connection of each said VCSEL is not directly connected to aground; and
   c) a microcontroller, wherein said microcontroller is configured to switch output from said first VCSEL to said second VCSEL in the event of failure by said first VCSEL, wherein a failure of said first VCSEL does not result a communication in link failure.

2. The optical interconnect device of claim 1, wherein said optical coupler comprises:
   a) a polymer wave guide, wherein said polymer waveguide comprises a first channel and a second channel, wherein said first channel and said second channel converge to a third channel;
   b) a first lens disposed to direct light output from said first VCSEL to said first channel of said polymer waveguide; and
   c) a second lens disposed to direct light output from said second VCSEL to said second channel of a polymer waveguide.

3. The optical interconnect device of claim 1, wherein said optical fiber coupler comprises:
   a) a first VCSEL lens, wherein said first VCSEL lens is configured to direct said light output from said first VCSEL to a first input of an interposer; and
   b) a second VCSEL lens, wherein said second VCSEL lens is configured to direct said light output from said second VCSEL to second input of said interposer, wherein said interposer comprises a first set of mirrors and a second set of mirrors, wherein said first set of mirrors are configured to direct said light output from said first VCSEL to a third lens, wherein said second set of mirrors are configured to direct said light output from said second VCSEL to said third lens, wherein said third lens is configured to direct said light output from said first VCSEL and said light output from said second VCSEL to an input of a multi-mode fiber.

* * * * *